(12) United States Patent
Xiao et al.

(10) Patent No.: US 7,430,123 B2
(45) Date of Patent: Sep. 30, 2008

(54) RACK FOR COMPUTER SYSTEM MODULES

(75) Inventors: Ren-Jun Xiao, Shenzhen (CN); Xiao-Lin Gan, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 168 days.

(21) Appl. No.: 11/528,090

(22) Filed: Sep. 27, 2006

(65) Prior Publication Data

US 2007/0109752 A1 May 17, 2007

(30) Foreign Application Priority Data

Nov. 11, 2005 (CN) .................... 2005 2 0067268 U

(51) Int. Cl.
 *H05K 7/20* (2006.01)
(52) U.S. Cl. .................. 361/724; 361/695; 361/687; 324/755
(58) Field of Classification Search ................. 361/685, 361/687, 695, 721, 724, 707, 752, 756; 324/158.1, 324/754–56, 761–762, 73 R
See application file for complete search history.

(56) References Cited

U.S. PATENT DOCUMENTS

| | | | | |
|---|---|---|---|---|
| 4,536,051 A * | 8/1985 | Smith et al. .................. 439/190 |
| 5,131,272 A * | 7/1992 | Minei et al. .................... 73/431 |
| 5,247,249 A * | 9/1993 | Seavey ........................ 324/756 |
| 5,396,186 A * | 3/1995 | Scheutzow .................. 324/754 |
| 5,682,289 A | 10/1997 | Schwegler |
| 5,894,225 A * | 4/1999 | Coffin ......................... 324/762 |
| 6,040,982 A * | 3/2000 | Gandre et al. ................ 361/724 |
| 6,054,869 A * | 4/2000 | Hutton et al. ................ 324/754 |
| 6,088,224 A * | 7/2000 | Gallagher et al. ............ 361/695 |
| 6,175,498 B1 * | 1/2001 | Conroy et al. ............... 361/704 |
| 6,307,750 B1 * | 10/2001 | Bendikas et al. ............. 361/725 |
| 6,469,530 B1 * | 10/2002 | Johnson et al. .............. 324/754 |
| 6,509,754 B2 * | 1/2003 | Lin et al. ..................... 324/755 |
| 6,762,932 B2 * | 7/2004 | Regimbal et al. ........... 361/683 |
| 6,819,099 B1 * | 11/2004 | Repko et al. ............. 324/158.1 |
| 6,900,648 B2 * | 5/2005 | Ou et al. ...................... 324/755 |
| 6,958,908 B2 * | 10/2005 | Lipski et al. ................. 361/695 |
| 7,286,338 B2 * | 10/2007 | Yamashita ................... 361/622 |
| 2004/0007379 A1 * | 1/2004 | Suzuki et al. ................. 174/59 |
| 2007/0096756 A1 * | 5/2007 | Parrish et al. ................ 324/754 |
| 2007/0152694 A1 * | 7/2007 | Yin et al. ..................... 324/765 |

\* cited by examiner

*Primary Examiner*—Jayprakash N Gandhi
*Assistant Examiner*—Courtney L Smith
(74) *Attorney, Agent, or Firm*—Morris Manning Martin LLP; Tim Tingkang Xia, Esq.

(57) ABSTRACT

A rack for mounting modules of a computer system to be tested includes a chassis including a bracing frame for mounting test components of the computer system, and a top panel attached to the chassis, the top panel includes a braces member, receiving a module for testing, the module is electronically connected to the test components.

17 Claims, 3 Drawing Sheets

RACK FOR COMPUTER SYSTEM MODULES

BACKGROUND OF THE INVENTION

1. Field of the Invention

The present invention relates to a rack for computer system modules, and particularly to a rack for holding system modules of a desktop computer during testing.

2. General Background

Mass produced computer system modules, such as compact disk-read only memories (CD-ROMs), floppy disk drives (FDDs), hard disk drives (HDDs), optical disk drives (ODDs), motherboards, switching power supplies (SPSs), TV tuner cards, and accelerated graphical port (AGP) cards are often mounted in a desktop computer. Conventionally, when testing a module, users install the module in a computer enclosure along with the needed devices for testing the module. The module must be detached or installed in regular testing process, such as, when a HDD is tested, the HDD is directly secured to a bracket of the computer enclosure using screws. Installation and removal of screws is unduly complicated, and reduces the efficiency of testing in mass production facilities. Furthermore, the module may be damaged by static discharge of users during the regular testing process.

What is needed is a rack which conveniently receives modules of a desktop computer to be tested as well as house the requisite components needed to accomplish the testing.

SUMMARY

An exemplary rack for receiving modules of a computer system to be tested includes a chassis including a bracing frame for mounting test components of the computer system, and a top panel attached to the chassis, the top panel includes a braces member, receiving a module for testing, the module is electronically connected to the test components.

Other advantages and novel features will become more apparent from the following detailed description when taken in conjunction with the accompanying drawings, in which:

DETAILED DESCRIPTION OF THE EMBODIMENT

Figure 1:
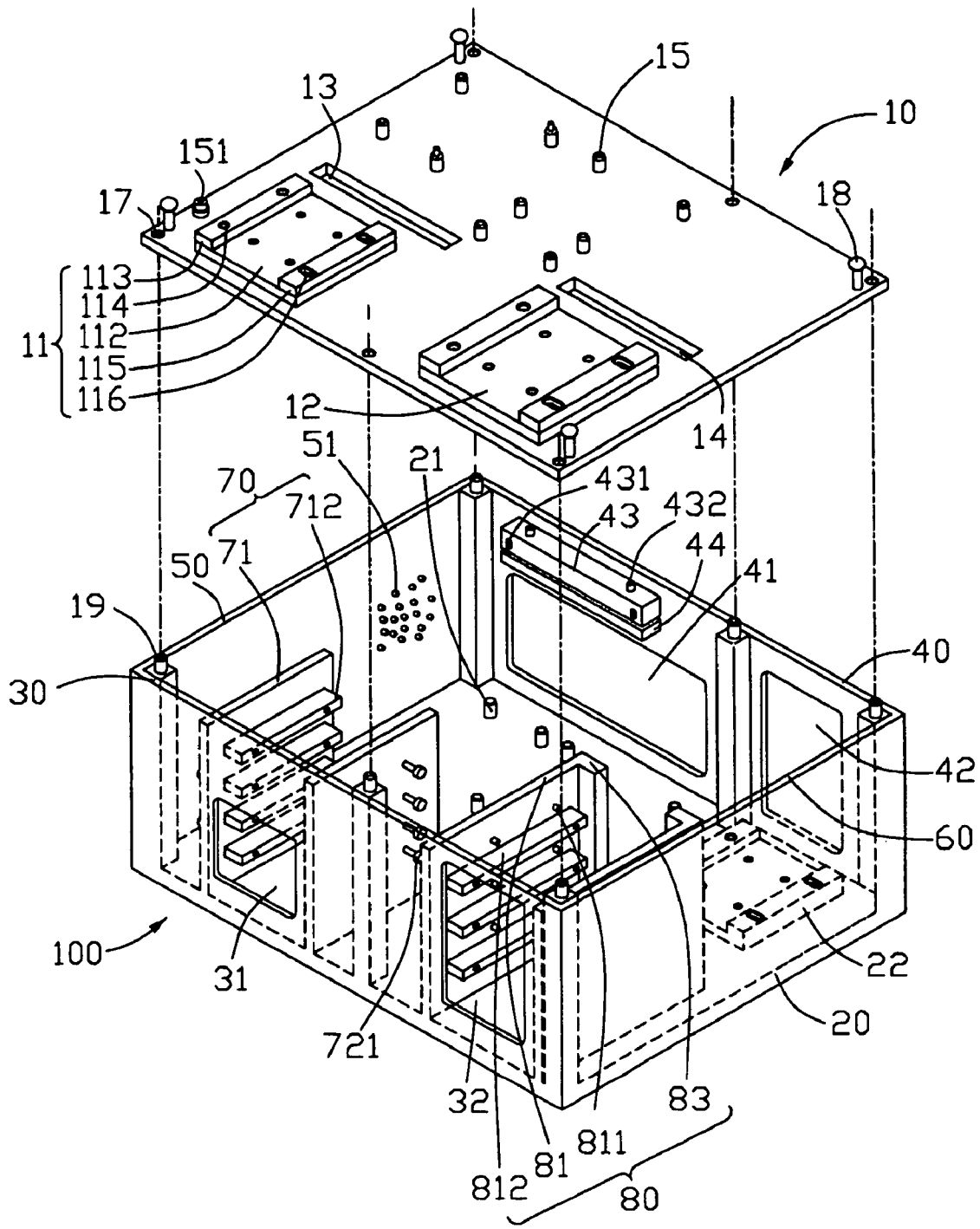
FIG. 1 is an exploded, isometric view of a rack in accordance with a preferred embodiment of the present invention.
Figure 2:
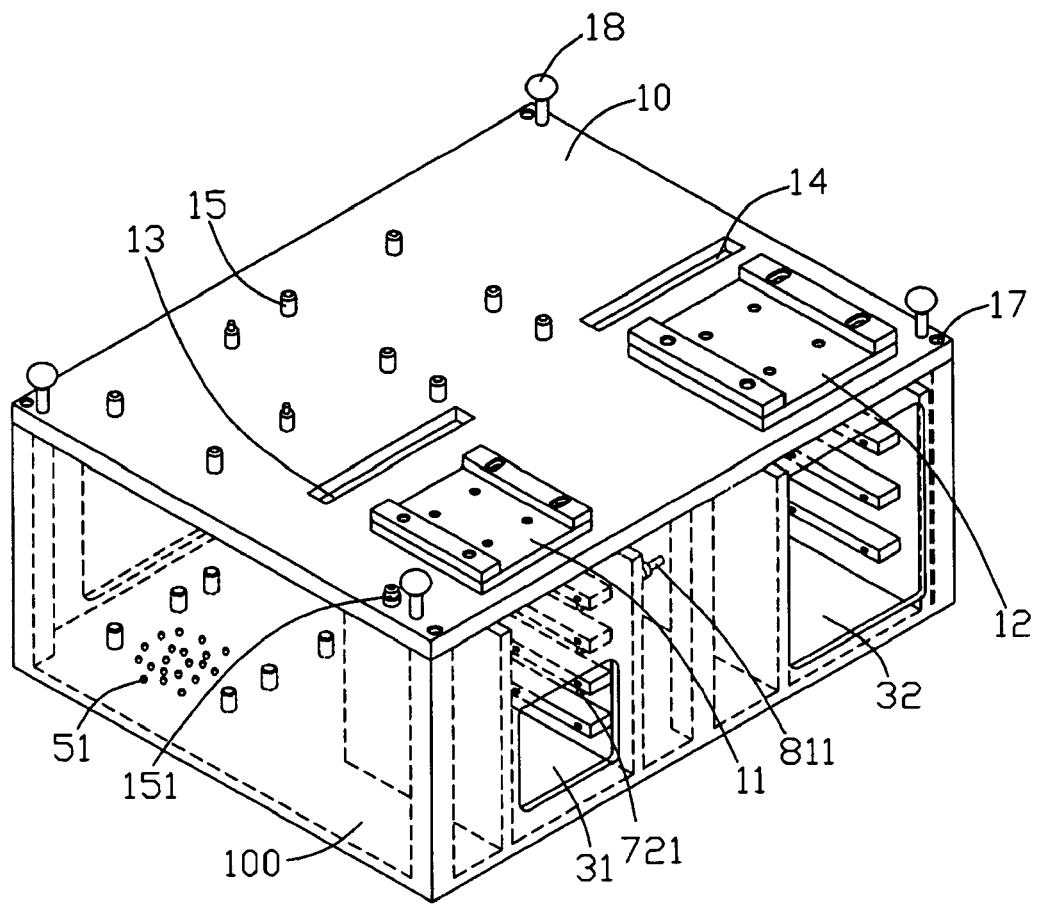
FIG. 2 is an assembled view of FIG. 1.

Referring to FIGS. 1 and 2, a mounting apparatus such as a rack in accordance with a preferred embodiment of the present invention includes a top panel 10 and a chassis 100. The chassis 100 is used for mounting test components of the computer system needed to test modules, such as a hard disk drive (HDD), a floppy disk drive (FDD), an optical disk drive (ODD), a switching power supply (SPS), and a motherboard. The top panel 10 is used for mounting a module to be tested, such as any one of a motherboard, an HDD, an FDD, and an ODD. The top panel 10 includes a plurality of brace members: two supports 11 and 12 each for mounting a data storage device, and a plurality of posts 15 for selectively fastening different kinds of motherboards. The chassis 100 includes a plurality of bracing frames: two brackets 70 and 80 each for mounting a data storage device, a plurality of posts 21 for selectively fastening different kinds of motherboards, and a support 22 for mounting a switching power supply (SPS).

The supports 11 and 12 are located in the front side of the top panel 10. The support 11 is used for mounting a HDD or a FDD, and the support 12 is used for mounting an ODD. The support 11 includes a bottom wall 112, a side wall 113 fastened to the bottom wall 112 via two screws 114, and a side wall 115 defining two elliptical shaped locking holes 116 thereof. When the side wall 113 is properly fastened to the bottom wall 112, bolts can be inserted into the locking holes 116 so that the side wall 115 is movable to selectively fasten different-sized HDDs or FDDs. The structure of the support 12 is the same as the support 11 but of a size to properly accommodate ODDs. Two openings 13 and 14 are defined in the top panel 10 corresponding to the supports 11 and 12. The opening 13 is used for extending a data transmission line and a power transmission line of the HDD or FDD being tested, therethrough. The opening 14 is used for extending a data transmission line and a power transmission line of the ODD being tested therethrough. The posts 15 are mounted on a rear portion of the top panel 10. A power switch 151 is mounted on a left portion of the support 11, and can be correspondingly connected to an electrical outlet of a motherboard mounted to the posts 15 to be tested. Four handles 18 are formed in the four corners of the top panel 10, for facilitating movement of the top panel 10 by users. Three through holes 17 are defined along each of two opposite long edges of the top panel 10.

The chassis 100 includes a bottom panel 20, four panels 30, 40, 50, and 60. Six braces 19 are formed along edges of the bottom panel 20 corresponding to the through holes 17.

The bracket 70 for mounting the HDD or the FDD, and the bracket 80 for mounting the ODD, are formed at a front portion of the chassis 100. The posts 21 are mounted on a rear portion of the chassis 100. When a motherboard is used as a test component mounted on the posts 21, and the power switch 151 can be selectively connected to the motherboard. The support 22 is also formed at the rear portion of the chassis 100, and structure of the support 22 is the same as the support 11.

The bracket 70 includes two side walls 71. Four support plates 712 are mounted to each side wall 71 via screws. The bracket 70 forms four layers for receiving HDDs and FDDs, first and second layers are in an upper place of the bracket 70, and third and fourth layers are in a lower place of the bracket 70. Four bolts 721 are attached to one of the side walls 71 to abut against a side of the HDDs and the FDDs, the bolts 721 are adjustable so as to fit different-sized HDDs and FDDs.

The structure of the bracket 80 is much the same as the bracket 70. The bracket 80 includes two side walls 81, and two baffles 83. Three support plates 812 are mounted to each side wall 81 via screws. The support plates 812 form three layers, for receiving the ODDs. Each baffles 83 is arranged at an edge of each side wall 81, for preventing ODDs from sliding out of the bracket 80. Six bolts 811 are mounted to one of the side walls 81 to abut against a side of the ODDs, the bolts 811 are adjustable so as to fit different-sized ODDs. A number of the layers of the brackets 70 and 80 is increased or decreased according to different applications.

A rectangular opening 31 is defined in the panel 30 corresponding to the third and the fourth layers of the bracket 70. A rectangular opening 32 is defined in the panel 30 corresponding to the bracket 80. An ODD can be placed directly in any one of the layers of the bracket 80 through the rectangular opening 32. An HDD or a FDD can be placed directly in the third or fourth layer through the rectangular opening 31, or the top panel 10 may be removed and the HDD or the FDD placed in the first or second layers of the bracket 70.

A rectangular opening 41 is formed in a rear of the panel 40 corresponding to the posts 21 of the bottom panel 20. A rectangular opening 42 is formed in the panel 40 corresponding to the support 22. A baffle plate 43 is mounted to the panel 40 through two elliptical shaped locking holes 431, corresponding to an upper area of the rectangular opening 41. A plate 44 is attached to the baffle plate 43 with two bolts, the plate 44 and the baffle plate 43 cooperate to receive TV tuner cards and AGP cards of a motherboard mounted thereon for use as test components. Bolts can be inserted in the locking holes 431 so that the baffle plate 43 is movable to accommodate mounting plates of different size. A plurality of holes 51 is defined in the panel 50 for heat dissipation.

Figure 3:
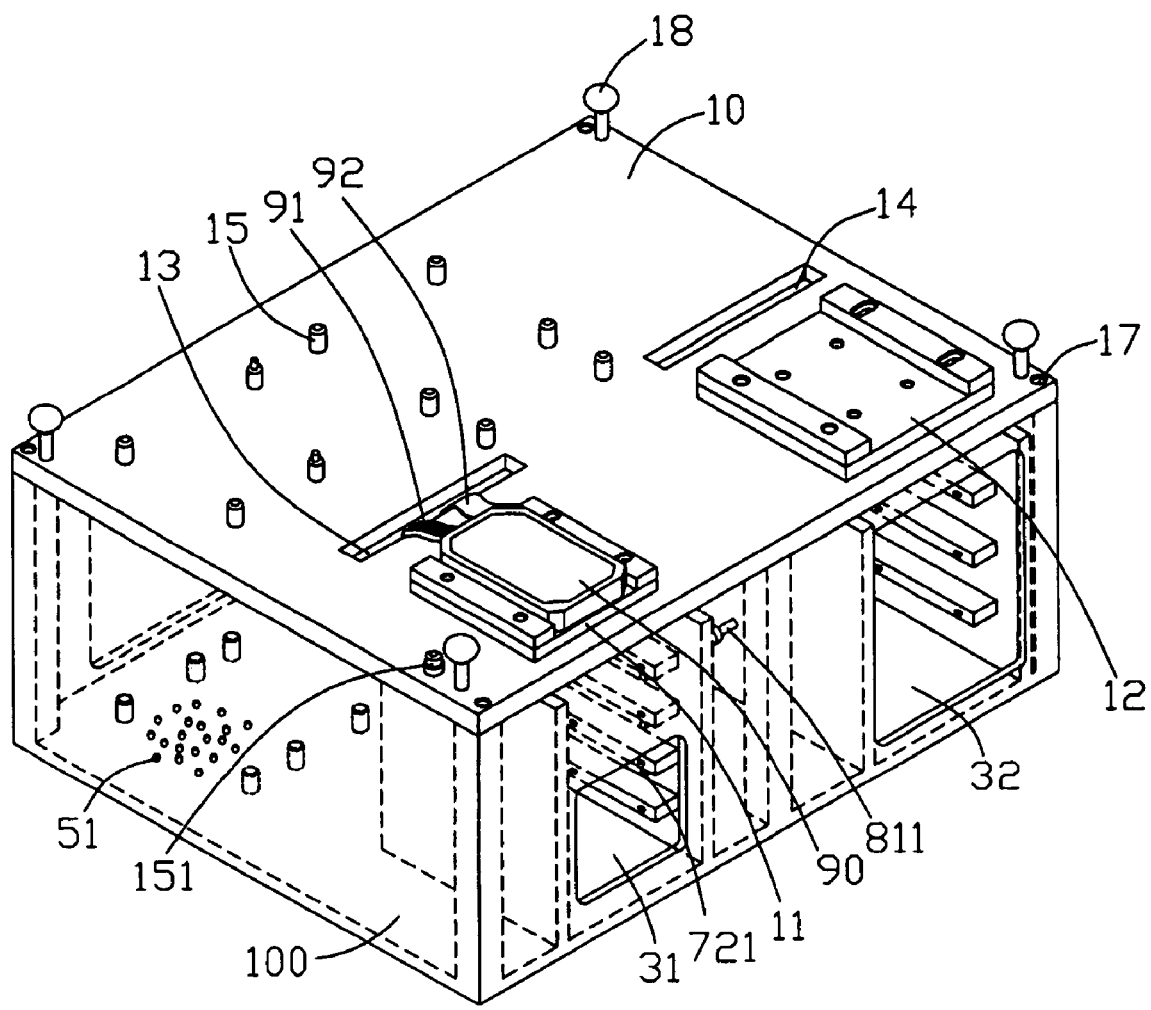
FIG. 3 is a hard disk drive (HDD) in the rack of FIG. 1.

Referring to FIG. 3, in testing computer modules, the module to be tested is placed in the top panel 10, and test components are placed in the chassis 100. For example, in testing an HDD 90, a motherboard is placed in the posts 21 of the bottom panel 20. An SPS is placed in the support 22. An FDD is placed in the third layer of the bracket 70 through the rectangular opening 31. An ODD is placed in one layer of the bracket 80 through the rectangular opening 32. An AGP card and a TV tuner card are mounted to the baffle plate 43 and the plate 44. Then, the HDD 90 is placed in the support 11. The data transmission line 92 from the motherboard and the power transmission line 91 from the SPS are respectively connected to the HDD 90 through the opening 13. Finally, the power switch 151 is turned on to begin the test. In this way users only need to change the HDD 90 of the support 11, to test a next one.

The panels 30, 40, 50, and 60 can be made of acrylic. The top panel 10, the braces 19, and the bottom panel 20 can be made of Bakelite. The Bakelite provides for inhibiting the buildup of static electricity of users, so that safety of the users is ensured. The rack accommodates a variety of sizes of various computer system modules, and is convenient to receive the modules to be tested.

It is believed that the present embodiment and it's advantages will be understood from the foregoing description, and it will be apparent that various changes may be made thereto without departing from the spirit and scope of the embodiment or sacrificing all of its material advantages, the example hereinbefore described merely being preferred or exemplary embodiment.

We claim:

1. A rack for receiving modules of a computer system to be tested, comprising:
a chassis comprising a bracing frame for mounting test components of the computer system the at least one module further comprises one of the motherboard, the HDD, the FDD, or the ODD; and
a top panel attached to the chassis and includes an opening, the top panel comprising a brace member, receiving the module for testing, the module being electronically connected to the test components by transmission lines extended through the opening to the module.

2. The rack as claimed in claim 1, wherein the top panel further comprises a plurality of through holes, a plurality of braces is formed around the chassis to engage with the through holes.

3. The rack as claimed in claim 1, wherein the brace member comprises a support for mounting a data storage device, the support comprises a bottom wall, and two side walls disposed on the bottom wall, one of the side walls of the support forms a plurality of elliptical shaped locking holes, a bolt is inserted into each of the locking holes thereby said one of the side walls is movable.

4. The rack as claimed in claim 1, wherein the brace member comprises a plurality of posts mounted on the top panel for selectively fastening different kinds of motherboards.

5. The rack as claimed in claim 1, wherein the bracing frame comprises a bracket for mounting a data storage device, the bracket comprises two side walls, a support plate is mounted to each of the side walls.

6. The rack as claimed in claim 1, wherein the bracing frame comprises a plurality of posts mounted on the chassis for selectively fastening different kinds of motherboards.

7. The rack as claimed in claim 1, wherein the test components of the computer system comprise one or more of a hard disk drive (HDD), a floppy disk drive (FDD), an optical disk drive (ODD), and a motherboard, the module of the computer system comprises one of the motherboard, the HDD, the FDD, and the ODD.

8. A rack for receiving modules of a computer system to be tested, comprising:
a chassis comprising a plurality of bracing frames for mounting test components of the computer system the at least one module further comprises one of the motherboard, the HDD, the FDD, or the ODD; and
a top panel attached to the chassis, the top panel comprising a brace member and a opening, the brace member being used for mounting the module of the computer system to be tested, transmission lines of the test components being extended through the opening to the module, the module and the test components cooperating to form the computer system.

9. The rack as claimed in claim 8, wherein the top panel further comprises a plurality of through holes, a plurality of braces is formed around the chassis to engage with the through holes.

10. The rack as claimed in claim 8, wherein the brace member comprises a support for mounting a data storage device, the support comprises a bottom wall, and two side walls disposed on the bottom wall, one of the side walls of the support forms a plurality of elliptical shaped locking holes, a bolt is inserted into each of the locking holes so that said one of the side walls is movable to selectively fasten different-sized data storage devices.

11. The rack as claimed in claim 8, wherein the brace member comprises a plurality of posts mounted on the top panel for selectively fastening different kinds of motherboards.

12. The rack as claimed in claim 8, wherein the bracing frame comprises a bracket for mounting a data storage device, the bracket comprises two side walls, a support plate is mounted to each of the side walls.

13. The rack as claimed in claim 12, wherein a plurality of bolts is attached to one of the side walls of the bracket to abut against a side of a data storage device, the bolts are adjustable so as to fit different-sized data storage devices.

14. The rack as claimed in claim 12, wherein the bracket further comprises a baffle arranged in an edge of each of the side walls, for preventing a data storage device from sliding out of the bracket.

15. The rack as claimed in claim 8, wherein the braces frames comprises a plurality of posts mounted on the chassis for selectively fastening different kinds of motherboards.

16. The rack as claimed in claim 8, wherein the test components of the computer system comprise a hard disk drive (HDD), a floppy disk drive (FDD), an optical disk drive (ODD), and a motherboard, the module of the computer system comprises one of the motherboard, the HDD, the FDD, and the ODD.

17. The rack as claimed in claim 8, wherein the top panel is made of Bakelite.

* * * * *